United States Patent
Pang et al.

(10) Patent No.: US 7,571,412 B1
(45) Date of Patent: Aug. 4, 2009

(54) METHOD AND SYSTEM FOR SEMICONDUCTOR DEVICE CHARACTERIZATION PATTERN GENERATION AND ANALYSIS

(75) Inventors: Hung Hing Anthony Pang, San Jose, CA (US); Binh Vo, San Jose, CA (US); Souvik Ghosh, San Jose, CA (US)

(73) Assignee: Altera Corporation, San Jose, CA (US)

( * ) Notice: Subject to any disclaimer, the term of this patent is extended or adjusted under 35 U.S.C. 154(b) by 215 days.

(21) Appl. No.: 11/377,714

(22) Filed: Mar. 15, 2006

(51) Int. Cl.
*G06F 17/50* (2006.01)

(52) U.S. Cl. .............. 716/12; 716/13; 716/14; 716/15; 716/16; 714/724; 714/725; 703/14; 703/19

(58) Field of Classification Search ............ 716/12–16; 714/724–725; 703/14, 19
See application file for complete search history.

(56) References Cited

U.S. PATENT DOCUMENTS

| | | | | |
|---|---|---|---|---|
| 4,807,161 A * | 2/1989 | Comfort et al. | ............. | 702/121 |
| 4,908,576 A * | 3/1990 | Jackson | ............ | 714/726 |
| 5,177,621 A * | 1/1993 | Ohtaki et al. | ............. | 358/406 |
| 5,648,913 A * | 7/1997 | Bennett et al. | ............. | 716/6 |
| 5,651,012 A * | 7/1997 | Jones, Jr. | ............. | 714/724 |
| 5,659,484 A * | 8/1997 | Bennett et al. | ............. | 716/16 |
| 5,790,479 A * | 8/1998 | Conn | ............. | 368/118 |
| 5,841,867 A * | 11/1998 | Jacobson et al. | ............ | 713/187 |
| 6,134,705 A * | 10/2000 | Pedersen et al. | ............. | 716/18 |
| 6,349,403 B1 * | 2/2002 | Dutta et al. | ............. | 716/12 |
| 6,625,797 B1 * | 9/2003 | Edwards et al. | ............. | 716/18 |
| 6,754,862 B1 * | 6/2004 | Hoyer et al. | ............. | 714/725 |
| 6,816,825 B1 * | 11/2004 | Ashar et al. | ............. | 703/14 |
| 6,826,717 B1 * | 11/2004 | Draper et al. | ............. | 714/39 |
| 6,886,152 B1 * | 4/2005 | Kong | ............. | 716/16 |
| 7,065,481 B2 * | 6/2006 | Schubert et al. | ............. | 703/14 |
| 7,076,751 B1 * | 7/2006 | Nixon et al. | ............. | 716/5 |
| 7,080,333 B1 * | 7/2006 | Ratchev et al. | ............. | 716/5 |
| 7,080,345 B1 * | 7/2006 | Iotov | ............. | 716/17 |
| 7,120,883 B1 * | 10/2006 | van Antwerpen et al. | ....... | 716/6 |
| 7,146,586 B2 * | 12/2006 | Bohl et al. | ............. | 716/4 |
| 7,203,919 B2 * | 4/2007 | Suaris et al. | ............. | 716/6 |
| 7,206,967 B1 * | 4/2007 | Marti et al. | ............. | 714/25 |
| 7,219,048 B1 * | 5/2007 | Xu | ............. | 703/19 |
| 7,257,795 B1 * | 8/2007 | Fung et al. | ............. | 716/12 |
| 7,337,100 B1 * | 2/2008 | Hutton et al. | ............. | 703/13 |
| 7,443,196 B2 * | 10/2008 | Redgrave et al. | ............. | 326/38 |
| 7,454,729 B1 * | 11/2008 | Kanji et al. | ............. | 716/6 |
| 2007/0185682 A1 * | 8/2007 | Eidson | ............. | 702/178 |

* cited by examiner

*Primary Examiner*—Naum B Levin
(74) *Attorney, Agent, or Firm*—Martine Penilla & Gencarella, LLP

(57) ABSTRACT

A method for generating automatic design characterization patterns for integrated circuits (IC) is provided. The method includes selecting a routing scheme from a file containing the device description of the routings of the IC. The routing scheme may be of a phase locked loop, clock tree, delay element, or input output block in one embodiment. Resource types for the routing scheme are identified and a path is defined, within constraints, between the resources. Once a path is defined, alternate paths are defined by retracing the path within constraints from an end of the path to the beginning of the path. An alternative path is then built and the alternative path shares a portion of the path previously defined. A computing system providing the functionality of the method is also provided.

14 Claims, 7 Drawing Sheets

METHOD AND SYSTEM FOR SEMICONDUCTOR DEVICE CHARACTERIZATION PATTERN GENERATION AND ANALYSIS

BACKGROUND

Description of the Related Art

The integrated circuits (ICs) today include complex hardware designs. One of the challenges for design engineers is to characterize properties, such as timing or power consumption, of the different circuits on a physical device to be compared against the simulation models. When the properties of a circuit on a physical device do not correlate with the simulation models, it is hard to determine which part of the design caused the malfunction as today's circuits are of considerable size with a large number of combinatorial logic layers. The device characterization is conducted by applying stimulus at the input(s) of a circuit and observing responses from the output(s) of a circuit. One of the ways the device characterization is conducted today is to generate stimulus by a signal generator, route the signals from the input pin(s) to the output pin(s) of the circuit and observe the responses on an oscilloscope (scope). However, the design may have several input pins, several output pins and several different paths that the signal will have to travel to reach the scope. Changing the different input and output pins manually, for testing, can be time consuming.

One of the proposed solutions to avoid manual changing of the different input and output pins is the use of switch matrices. On the input side, a switch matrix functions like a router where the signals are routed from a signal generator to different input pins automatically. Similarly, on the output side, a switch matrix functions like a router where the signals are routed from different output pins to the scope automatically. The switch matrices can be controlled by software. Moreover, the switch matrices provide the user with the ability to make different types of measurements. However, the user has to provide the base characterization patterns for the ICs to make use of the full potential of the switch matrices. In the case of a complex circuit, such as SRAM-based FPGAs, the user has to provide a large number of base characterization patterns, which is time consuming, as the process is manual and labor intensive. Also, the number of base characterization patterns provided by the user is not exhaustive.

It is therefore desirable to be able to generate an exhaustive list of base characterization patterns automatically, in a non-labor intensive manner. It is further desirable to be able to identify the part of a design that caused a discrepancy between the simulation result and the actual result in a property of the physical device.

SUMMARY

Broadly speaking, the present invention fills these needs by providing a method and system for generating automatic design characterization pattern for ICs. The embodiments of the invention generate automatic design characterization patterns that use common paths as much as possible.

In one aspect of the invention, a method for generating automatic design characterization patterns for integrated circuits (IC) is provided. The method includes selecting a routing scheme from a file containing the device description of the routings of the IC. The routing scheme may be of a phase locked loop, clock tree, delay elements, input block or output block in one embodiment. Resource types for the routing scheme are identified and a path is defined, within constraints, between the resources. Once a path is defined, alternate paths, which are minimally divergent, are defined by retracing the path within constraints from an end of the path to the beginning of the path. An alternative path is then built and the alternative path shares a portion of the path previously defined. In one embodiment, actual and simulated results for timing along the paths are compared to identify any discrepancies so that the simulated design timing model may be updated to provide a more accurate representation. In another embodiment, actual and simulated results of power consumption using the paths are compared to identify any discrepancies so that the simulated design model may be updated to provide a more accurate representation.

In another aspect of the invention, a computing system for characterizing an integrated circuit is provided. The computing system includes a processor, an I/O module for user input and output, and a memory in communication with the processor. The memory includes program instructions to be executed by the processor. The program instructions cause the processor to perform the operations discussed above in order to generate characterization patterns and compare the simulated and actual timing/power requirements. In one embodiment, the automated measurement system is integrated into the computing system. In another embodiment, the design software providing the simulation of the IC design is included in the computing system.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

An invention for automatically generating base characterization patterns for ICs for measuring different features of an IC design is provided. The embodiments of the invention provide a script interface for the pattern generation tool to specify the direction for routing by confining the routing path.

Figure 1:
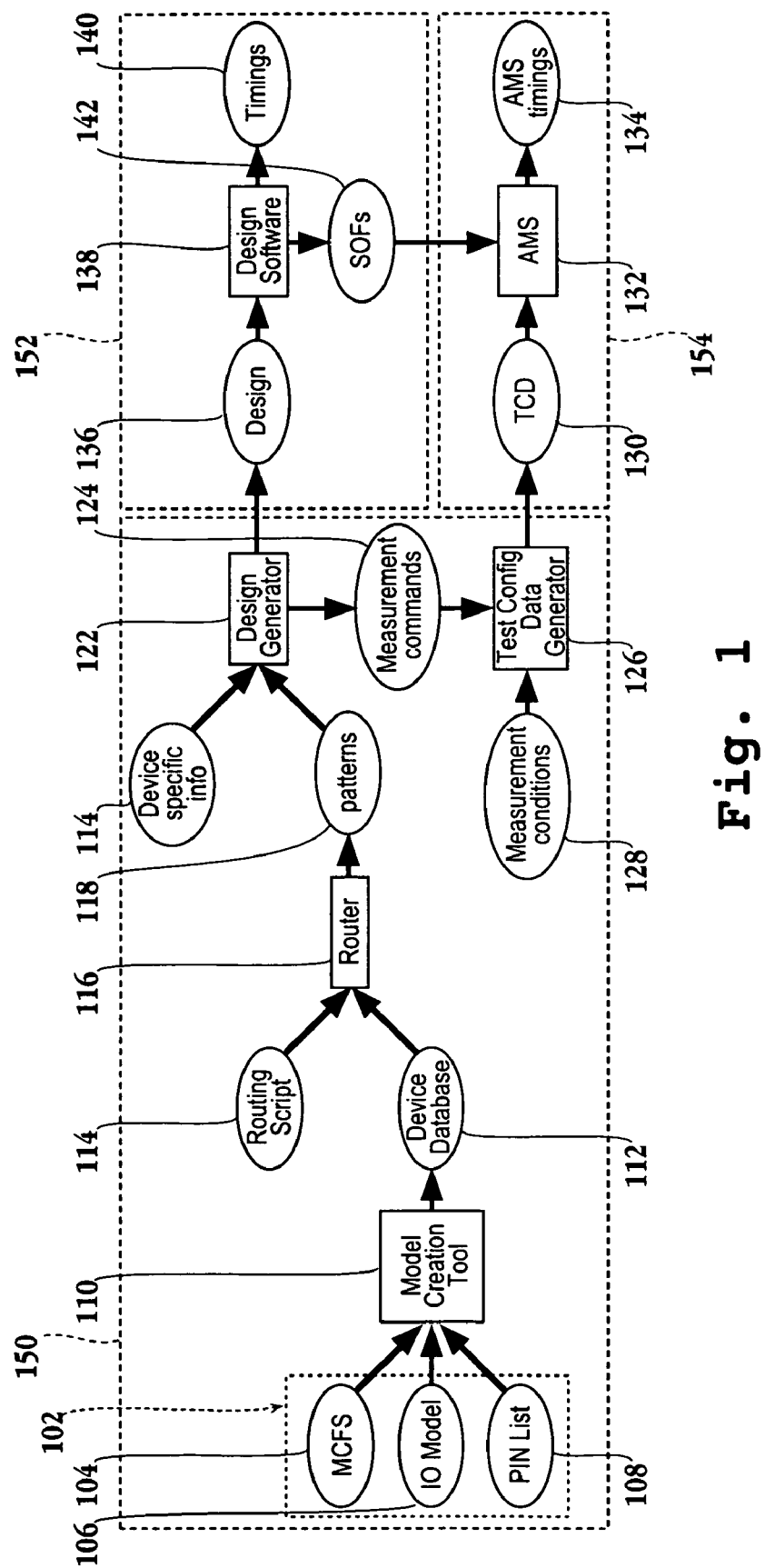
FIG. 1 shows a schematic diagram illustrating automatic base characterization pattern generation, in accordance with an embodiment of the present invention.

FIG. 1 shows a schematic diagram illustrating automatic base characterization pattern generation, in accordance with an embodiment of the present invention. FIG. 1 includes input files 102, model creation tool 110, device database 112, routing script 114, router 116, patterns 118, device specific information 120, measurement conditions 128, test configuration data generator 126, design generator 122, and measurement commands 124. Input files 102 are shown to include connectivity graph (MCFS) 104, input/output (I/O) model 106, and pin list 108. Connectivity graph 104 is a data file representing the programmable interconnections of the IC in graphical form, and may be generated by design software including the QUARTUS design package owned by the assignee. MCFS 104 includes a graphical representation of the programmable interconnections for the clock trees, the phase locked loops (PLL), the delay elements etc. I/O model 106 is a file that describes the input blocks and output blocks of the IC, and pin list 108 is a file representing the pin configuration for the board that the IC will be integrated onto.

Model creation tool 110 receives input files 102 and generates a device database containing a single data file, which is a binary representation of the routing structure of the IC. In one embodiment, the single data file contains such information as a device graph representation of the IC, based on the information extracted from connectivity graph file 104, I/O model 106, and pin list 108. The single data file within the database 112 contains more information than what is required for routing. Therefore, routing script 114 culls the required information for a specific portion of the IC from the single data file by specifying the characterization plan of the device in the form of routing constraints. For example, the routing script 114 can cull out information required for characterizing the timing for the I/O, the timing for the clock tree, the timing for the PLL, etc. Router 116 reads the representation of the IC stored in the device database. Based on user commands, router 116 generates patterns 118 for a specific portion of the IC. In one embodiment, router 116 is designed to support device characterization based on path differences among patterns.

The generated patterns 118 are forwarded to a design generator 122. Design generator 122 generates design files 136 using patterns 118 and device specific information 120. Device specific information is based on the type of IC that is being used. For example, in the case of a field programmable gate array (FPGA), the design generator would require specific information about the FPGA family that is being characterized, which is provided by design specific information 120. Design files 136 are used by the simulation tool of the design software 138 to create the timing report 140 for the specific portion of the IC. An example of the design software is the QUARTUS software that is owned by the assignee of the present invention. Timing report 140 represents the expected timings generated through the simulation tool of the design software 138. Design software 138 is further shown to generate a serial object file (SOF) 142 for different portions of the IC. One skilled in the art will appreciate that SOF 142 may be used for programming a programmable logic device, e.g., a FPGA, during development.

Design generator 122 also outputs measurement commands 124 that are used by the test configuration data generator 126, to obtain a configuration file 130. Measurement commands 124 and measurement conditions 128, which accounts for the measurement conditions, such as temperature, are provided as input into test configuration data generator 126. A configuration file (TCD) 130, from test configuration data generator 126, is used by the automatic measurement system (AMS) 132 to obtain the actual (physical) timing measurement for the IC. AMS 132 is used to load the test configuration data and the SOF for the IC and to automatically obtain the actual measurements for the different input or output pins by controlling the switch matrices automatically. The timing report generated by AMS 132 is stored in AMS timing database 134. The corresponding timing data within AMS timing database 134 and timing report 140 are compared so that the actual and expected values can be checked to correlate. If there is a difference, the reason for the difference may be identified by path differences and the simulation tool can be updated to accurately represent the timing so that a customer utilizing the simulation tool will have accurate information. It should be appreciated that sections 150, 152 and 154 represent separate functionality provided in the overall system. In section 150, the characterization patterns are automatically generated so that the AMS may be used to test respective patterns. In section 152, the simulated design is generated as part of the design process to provide the expected timing or power requirements. In section 154, the actual timing or power measurements are performed on the physical device utilizing the characterization patterns generated in section 150. It should be noted that the embodiments described herein enable the design characterization patterns to be exhaustively generated through router 116 and routing script 114, without the need for manual generation, where the exhaustive generation of all the characterization patterns is physically impossible.

Figure 2:
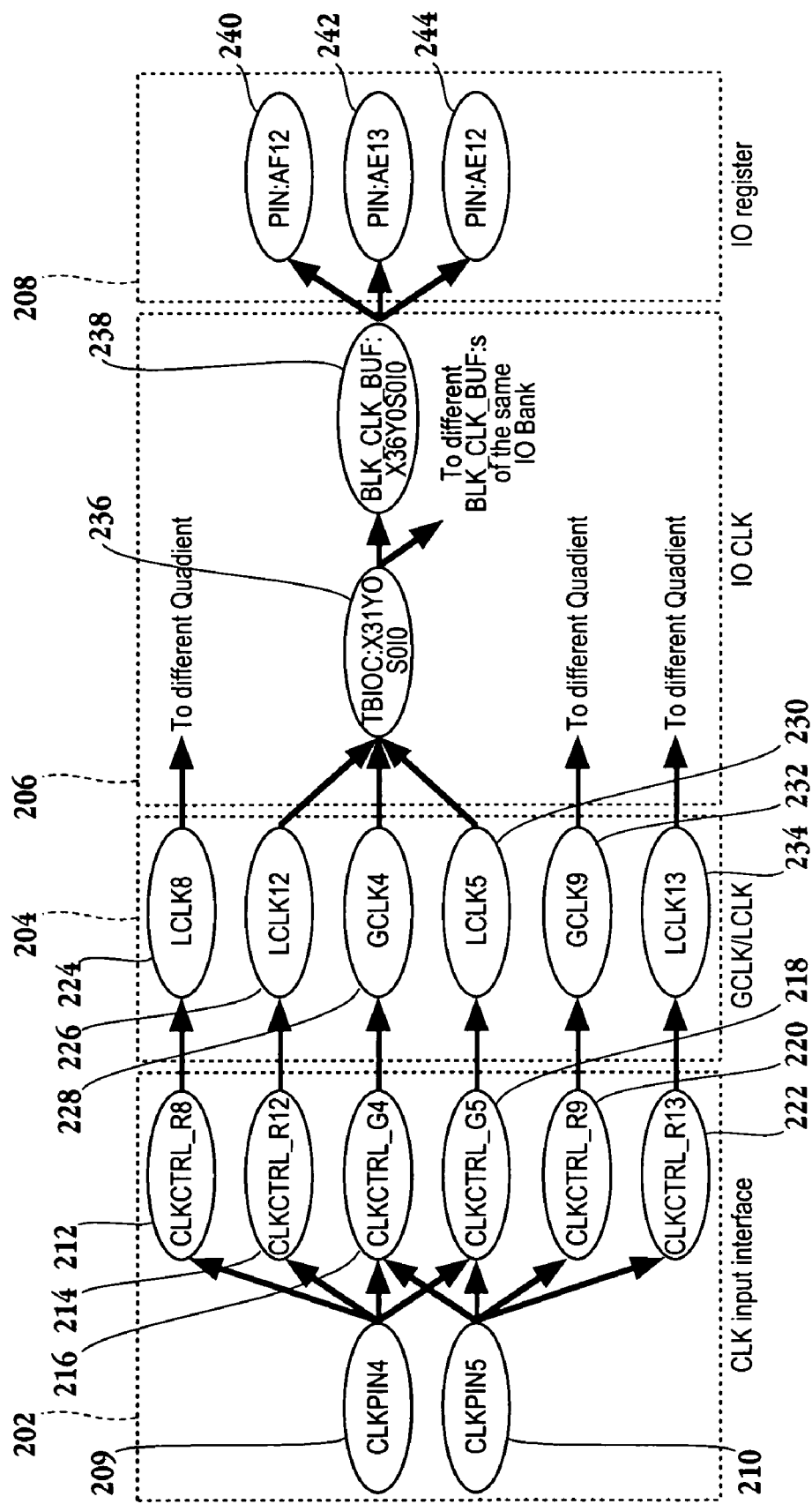
FIG. 2 shows an exemplary device graph for the clock tree, in accordance with an embodiment of the present invention.

FIG. 2 shows an exemplary device graph for the clock tree, in accordance with an embodiment of the present invention. The device graph includes clock input interface 202, clock tree core 204, I/O clock 206, and I/O register 208. Clock input interface 202 includes two clock input pins 209 and 210 and clock controls 212, 214, 216, 218, 220, and 222. Clock controls 212, 214, 220, and 222 control local clocks 224, 226, 232, and 234, respectively. Similarly, clock controls 216 and 218 control global clocks 228 and 230, respectively. As shown, the signals from clock pins 209 and 210 may reach the I/O pins 240, 242, and 244 of the I/O register 208 through local clock 226, and global clocks 228 and 230. I/O clock 206 includes TBIOC (Top and bottom input/output clock) 236 and clock to an I/O block (BLK_CLK_BUF) 238. As can be seen, the three I/O pins 240, 242, and 244 can be characterized by generating three different paths for the corresponding three I/O pins 240, 242, and 244 from two clock input pins 209 and 210.

Figure 3:
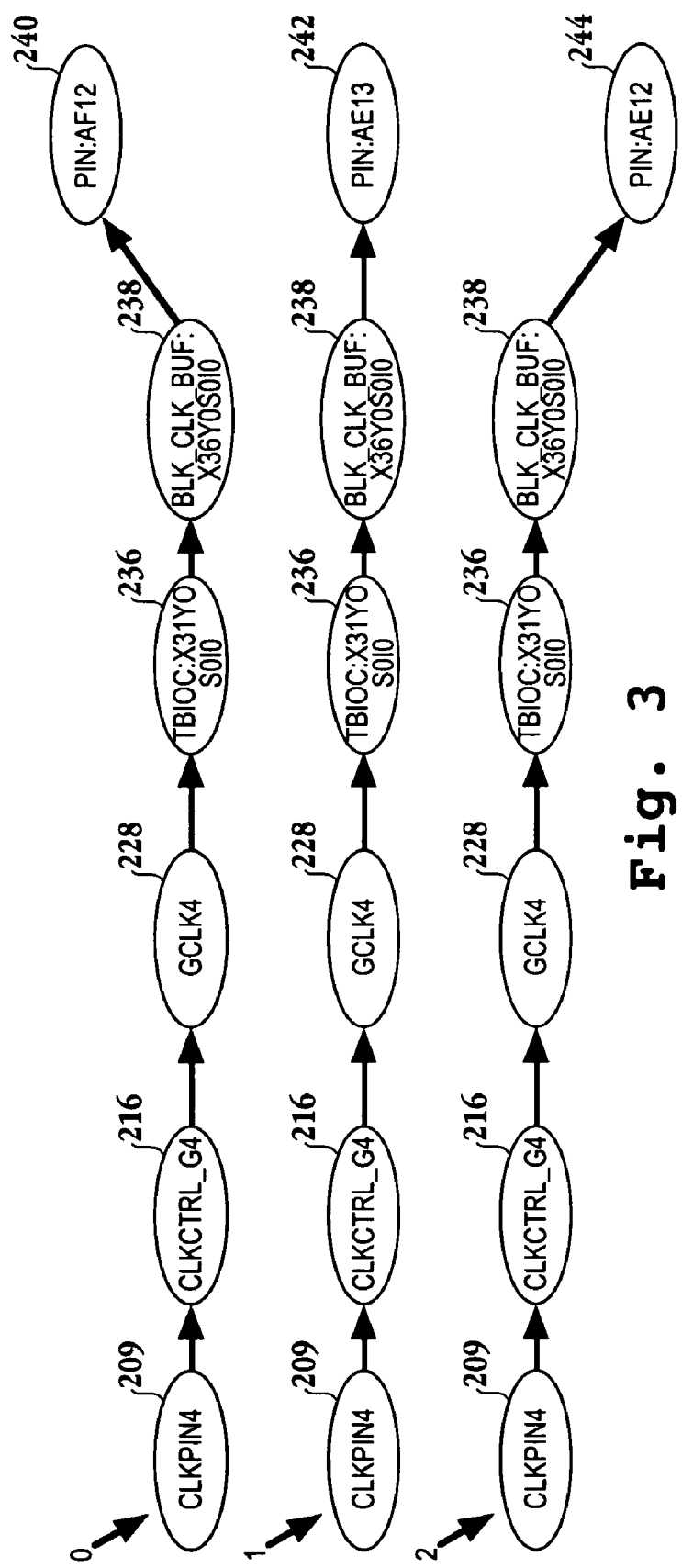
FIG. 3 shows three exemplary paths for characterizing the three I/O pins of FIG. 2, in accordance with an embodiment of the present invention.

FIG. 3 shows three exemplary paths for characterizing three I/O pins 240, 242, and 244 of FIG. 2, in accordance with an embodiment of the present invention. FIG. 2 shows path 0, path 1, and path 2. When characterizing three I/O pins 240, 242, and 244, path 0, path 1, and path 2 remain the same from clock pin 209 to BLK_CLK_BUF 238. The only difference in the path is at the three I/O pins 240, 242, and 244. By comparing the measurements such as the timing measurements of path 0, path 1, and path 2, the performance of the three I/O pins 240, 242, and 244 can be tested. For example, if the expected timing from the simulation reveals that the timing should be the same for each of paths 0, 1, and 2, i.e., the paths are symmetrical with regard to the routing of BLK_CLK_BUF 238 to the corresponding three I/O pins, the actual timing may show that the paths are not the same. As the only difference in the paths is between BLK_CLK_BUF 238 and the corresponding I/O pins, this must account for the difference. During the actual manufacturing of the IC being tested, there may have been some change from the simulated layout. This change will be captured in the actual testing and then the simulated timing can be adjusted to reflect this change, thereby allowing the design application to accurately reflect the actual timing for future designs using the IC.

Figure 4:
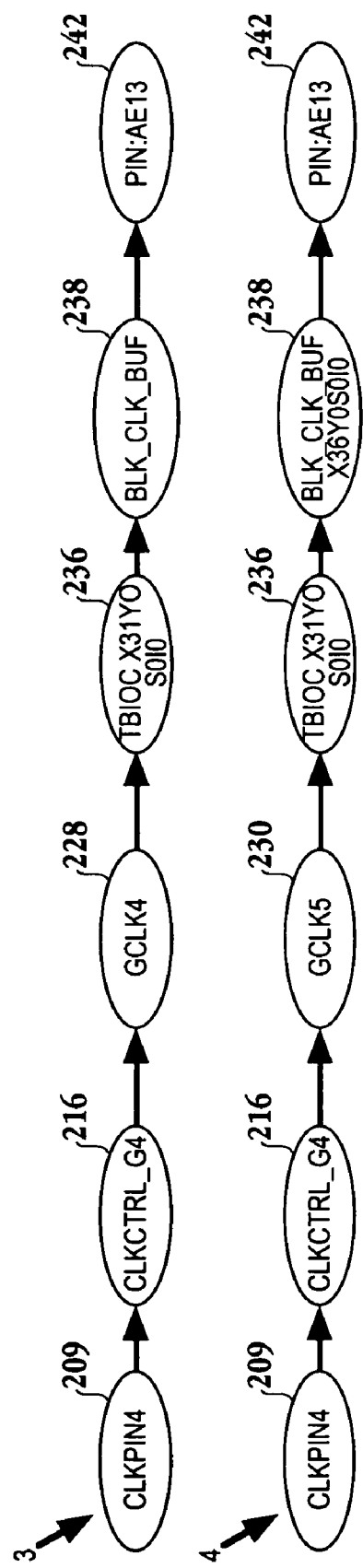
FIG. 4 shows two exemplary paths for characterizing global clocks of FIG. 2, in accordance with an embodiment of the present invention.

FIG. 4 shows two exemplary paths for characterizing global clocks 228 and 230 of FIG. 2, in accordance with an embodiment of the present invention. In FIG. 4, path 3 and path 4 are similar except for the portion of the global clock 228 and global clock 230. Thus, by measuring and comparing the timing for path 3 and path 4, the performance of the global clock 228 and global clock 230 can be determined. For example, if there is a difference in the timing between path 3 and path 4, the designers can focus on the portion of the global clock 228 and global clock 230 and determine which one of the global clock 228 or global clock 230 is the cause of the problem. Moreover, measures can be taken to compensate for the timing differences. Thus, numerous patterns are generated and these patterns can be used to compare the actual and expected values in order to identify where the timing differs between the simulation and the actual chip design. Referring back to FIG. 2, the timing between clkpin4 209 and clkpin5 210 to I/O pin 242 may be tested by keeping the path between these clock pins and I/O pin 242 the same. For example, from each of the respective clock pins, the path may be defined as proceeding through resource types 216, 228, 236, and 238.

Even though FIGS. 3 and 4 illustrate characterizing I/O pins and global clocks, one skilled in the art should understand that other parts of the routing path may be characterized in the similar manner. The concept is to use a common path as much as possible except for the particular resources that are under characterization. The exemplary resources may be clock pins, global clocks, local clocks, I/O pins, etc. One skilled in the art should understand that the exemplary resource list provided is not exhaustive, for example delay paths, (i.e., data input, output, and clock delays, and functional modes (i.e., PLL compensation mode, PLL feedback mode, PLL no compensation mode). Resources may also include a singular node such as clocks and pins, or grouped logic such as delays and functional modes.

Figure 5:
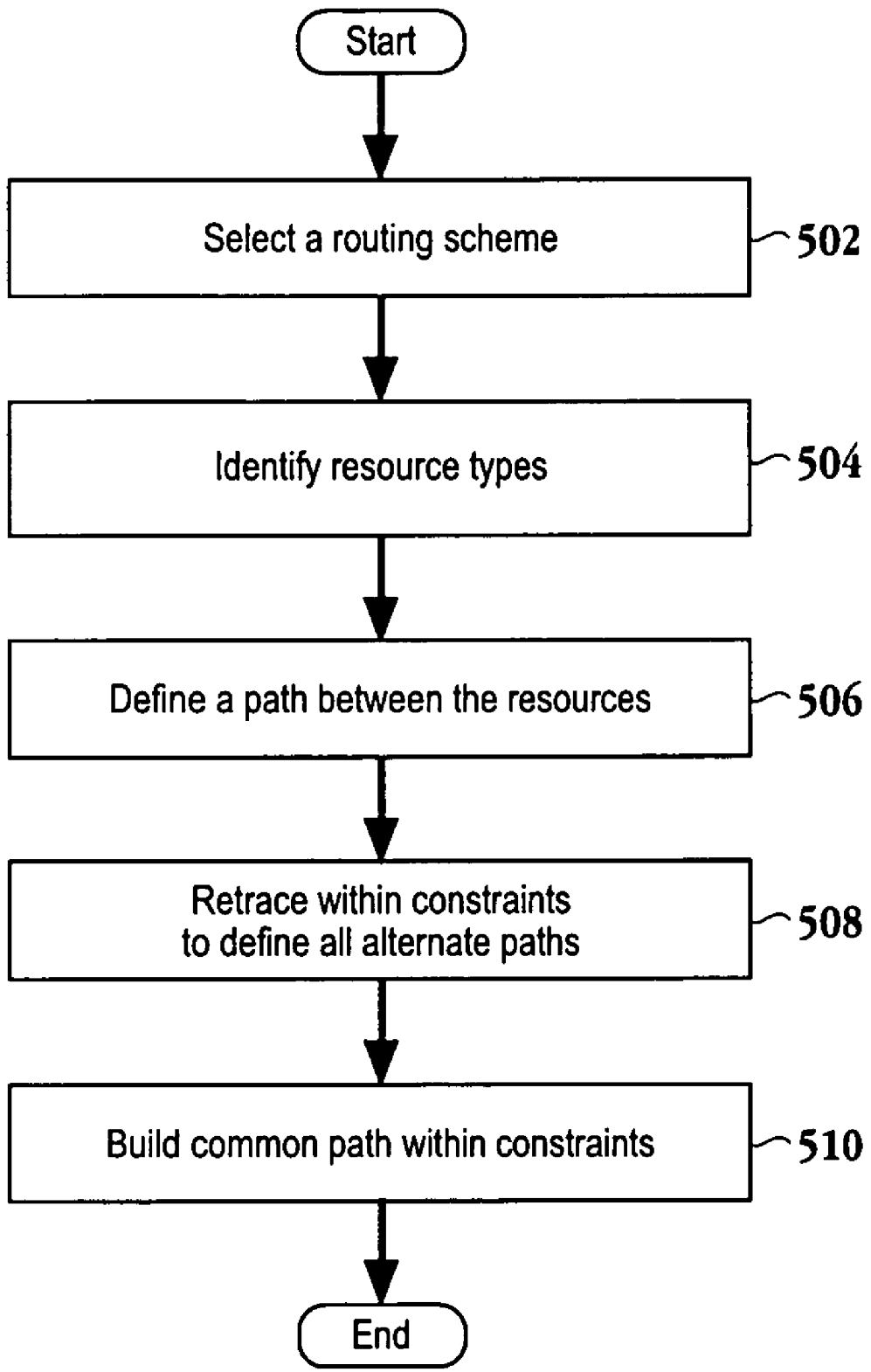
FIG. 5 is a flow chart illustrating the method of operations involved in generating the different paths for characterizing the different resources, in accordance with an embodiment of the present invention.

FIG. 5 is a flow chart illustrating the method of operations involved in generating the different paths for characterizing the different resources, in accordance with an embodiment of the present invention. The method begins with operation 502, where a certain routing is selected. As described above with FIG. 1, the device database contains a file having all the possible different routings from which a selection can be made. For example, the routing may be for I/O, phase locked loop (PLL), clock pins, etc. In one embodiment, a routing script selects a particular routing or routings from the device database. Thereafter in operation 504, resource types within the routing scheme are identified. The resource types may be clock pins, clock controls, global clocks, local clocks, I/O pins, etc. Next in operation 506, a path is defined between the resource types while traversing the path in a first direction. Once a path is established, alternate paths are defined by retracing the path in a second direction limited by certain constraints as indicated in operation 508. In one embodiment, the path is traced in the reverse direction and at each resource type of the path an alternative path segment is identified. This is repeated for each resource type until the beginning of the path is reached. The constraints can include blocking certain segments in one embodiment. Subsequently, the alternate path will be built as set by the constraints, while traversing the path in the first direction. Thus, with regard to FIG. 3, path 1 may be initially defined, and then while retracing the path, alternative paths 0 and 2 may be identified. As described above, the common path is used as much as possible in order to easily identify path segments where timing differences may arise. Therefore, the routing path generated will include returning to the established path set by the constraints in order to accommodate using the common path as much as possible, as shown in operation 510. In one embodiment, the constraints help to confine and define the routing path by reducing the available resources in the path to a single resource.

The method of operations illustrated in FIG. 5 can be further explained with use of an example. In this example, the method described above is used to generate three exemplary paths path 0, path 1, and path 2 of FIG. 3 for characterizing three I/O pins 240, 242, and 244 of FIG. 2. Referring back to FIG. 1, the device database 112 contains the connectivity graph and the I/O model of the IC. In this example, the I/O model and the connectivity graph for I/O pins 240, 242, and 244 are selected. Next, the resources types are identified. In this case the resource types are the clock pin 209, clock control 216, global clock 228, and TBIOC 236, and BLK_CLK_BUF 238, and I/O pin 240. Next, a path is defined between each of the referred resource types, i.e., path 0 of FIG. 3. After that, the path is retraced to define an alternate path. In this example, the path is retraced from I/O pin 240 back to BLK_CLK_BUF 238 and defines the alternate path to I/O pin 242, i.e., path 1 of FIG. 3 and path 2 to I/O pin 244. As can be seen, all the paths from BLK_CLK_BUF 238 to I/O pins 240, 242 and 244 are exhausted at this point. Therefore, the retracing is continued back towards TBIOC 236 to define a new path to another resource. In one embodiment, the alternate path from resource type 236 may be blocked through a constraint, therefore, the retracing continues. The method described above will retrace the path through each resource type until the beginning is reached. Once a new path is defined, the method includes identifying or building the new path. In one embodiment, when building the new path, once a deviation from the original path occurs, the method includes returning to the original path so as to share the first path as soon as possible after deviating to the new path. In essence the common path is maintained as much as possible. In regards to the above-described example, the common path is maintained from clock pin 209 to BLK_CLK_BUF 238 and the only difference in the path is from BLK_CLK_BUF 238 to the different I/O pins 240, 242, and 244.

An exemplary script to control router 116 of FIG. 1 to generate different characterization patterns is shown below in Table 1. All the statements in the script start with the command key word ROUTE and it takes two arguments, i.e., a format string and a routing constraint. Line numbers 1-7 are added for explanation purposes only. The format string is IO_TEST and the string will be used to create the measurement name by appending the measurement type and the pattern number. The routing constraint is provided within the curly brackets. Each of the statements starts with a routing command, followed by a resource constraint and further followed by zero or more attribute settings.

The EXHAUSTIVE command will explore everything that satisfies the resource constraint, i.e. CLKPIN: i1={4} in FIG. 2. As there is only one CLKPIN4 209 in the device, as indicated in FIG. 2, this constraint reduces to a single resource that represents the CLKPIN4 209. The second routing command looks for all the fan-outs of CLKPIN4 that satisfy (CLKCTRL_G: i1={4}. Thus, CLKCTRL_G5, CLKCTRL_R8 212, CLKCTRL_R9 220, CLKCTRL_R13 222, and CLKCTRL_R12 214 will be excluded from routing. The exemplary script reduces each constraint from CLKPIN4 to BLK_CLK_BUF, into a single resource. However, in command 6, resource type is specified as PIN and therefore any fan-out of BLK_CLK_BUF 238 that belongs to PIN type would satisfy the routing constraint. Thus, command 6 would create characterization patterns for each PIN reachable by BLK_CLK_BUF 238. In the case of FIG. 2, this would include PIN 240, PIN 242 and PIN 244.

TABLE 1

```
ROUTE "IO_TEST" {
1      EXHAUSTIVE (CLKPIN: iI={4});
2      EXHAUSTIVE (CLKCTRL_G: iI={4});
3      EXHAUSTIVE (GCLK: iI={4});
4      EXHAUSTIVE (TBIOC: iX={31}, iY={0}, iS={0}, iI={0});
5      EXHAUSTIVE (BLK_CLK_BUF: iX={36}, iY={0}, iS={0},
           iI={0});
6      EXHAUSTIVE (PIN), MEASUREMENT=(TSU, TH);
7 };
```

TABLE 2

| Pattern | Temp | VCCQ | VCCN | Tsu −3 | Tco −3 | Th −3 | Tsu −4 | Tco −4 | Th −4 | Tsu −5 | Tco −5 | Th −5 |
|---|---|---|---|---|---|---|---|---|---|---|---|---|
| P1 | 85 C. | 1.12 | 3.135 | 30.4 | 34.5 | 34.9 | 30.4 | 34.5 | 34.9 | 30.4 | 34.5 | 34.9 |

In one embodiment, the common path is maintained by having a counter for each resource in device database 112 of FIG. 1. Each time a path is created, the counter value of all the resources along the path is incremented. When the retracing operation is conducted, each time a resource is reached, all the fan-out constrained resources from that resource having a counter value of 0 are identified, as the counter 0 indicates that a potential new path may be created. Once a new resource is identified, the next resource to follow will be the constrained resource with the highest counter value among the new resource's fan-outs. That is, once a subsequent path deviates from the original path, a path segment associated with the highest counter value is used when there is a choice in order to return to the first path as soon as possible after deviating from the first path. This ensures that the most common path is used as much as possible.

Figure 6:
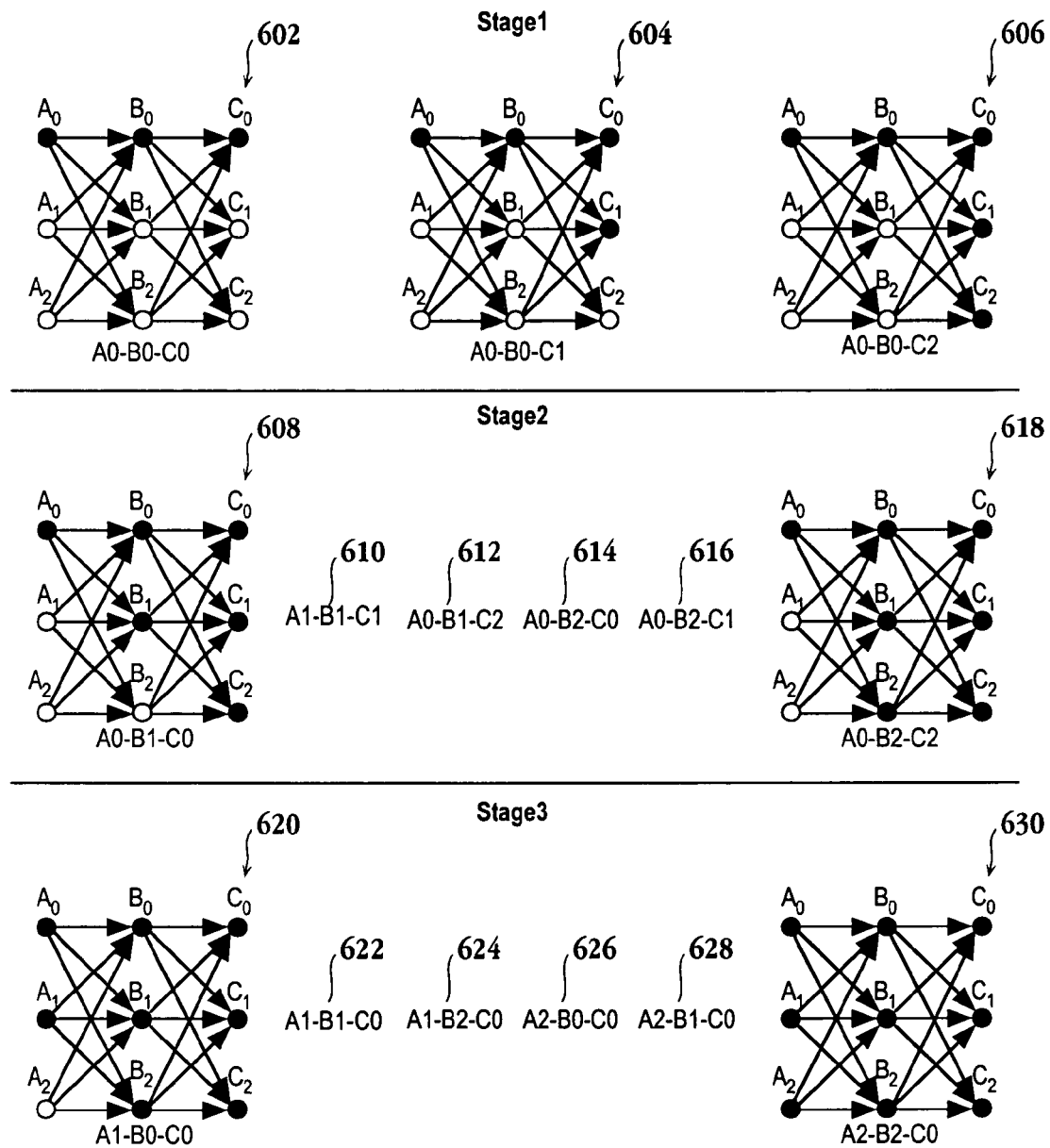
FIG. 6 shows exemplary structures for the paths generated, in accordance with an embodiment of the present invention.

FIG. 6 shows exemplary structures or characterization patterns for the paths generated, in accordance with an embodiment of the present invention. The structures 602-630 are shown to include 9 nodes A0-C2 in three stages. Each of the nodes A0-C2 represents a resource such as a wire and each of the lines between the nodes represents a multiplexer, in one embodiment. Each subsequent paths represented by structures 602-630 is different from the previous path by the least number of nodes. Following are the exemplary paths represented by structures 602-630:

Path 0: A0-B0-C0
Path 1: A0-B0-C1
Path 2: A0-B0-C2
Path 3: A0-B1-C0
Path 4: A0-B1-C1
Path 5: A0-B1-C2
Path 6: A0-B2-C0
Path 7: A0-B2-C1
Path 8: A0-B2-C2
Path 9: A1-B0-C0
Path 10: A1-B1-C0
Path 11: A1-B2-C0
Path 12: A2-B0-C0
Path 13: A2-B1-C0
Path 14: A2-B2-C0

As can be seen, the difference in nodes between path 0 and path 1 are C0 and C1. In path 1, an alternate path 6 is defined between B0 and C1. Subsequent to generating the structures 602-630, the actual and simulated measurements of different variables for the different paths may be taken and compared. Since there is only one node difference between two neighboring paths, the path which caused the difference in measurements can be isolated. In one embodiment, the results of the measurements are stored in a data file. Some of the examples of the measurements are hold time (Thold), clock out (Tco), setup time (Tsu), maximum frequency (Fmax), power, etc. The format for the files generated for the simulated timing report and the actual timing report may be as follows in Table 2:

Thus two of the files will be generated, one for the actual results from the AMS and the simulated results through the design simulation software application.

Table 3 lists the meaning for exemplary measurement types available to be compared between the simulated design and the actual testing.

TABLE 3

TSU—setup time measurement
TCO—one pin clock-to-output measurement
TCO2—two pins clock-to-output measurement
TH—hold time measurement
TSUPLL—setup time measurement with assert ARESET and checking LOCK signal
TCOPLL—one pin clock-to-output measurement with assert ARESET and checking LOCK signal
TCO2PLL—two pins clock-to-output measurement with assert ARESET and checking LOCK signal
THPLL—hold time measurement with assert ARESET and checking LOCK signal The routing script may have various other portions or stirrings for control of the router to generate the characterization patterns. In one embodiment, the script is a text file that contains a sequence of commands. The additional strings include a format string for creating a file name for each pattern. In one embodiment, stamping may be used to further specify the desired path, i.e., to use the common path as much as possible. The following scripts provide an example on specifying the use of the common portion of multiple paths.

Script 1

```
1      ROUTE "IO_TEST" {
2          EXHAUSTIVE (CLKPIN: iI={4});
3          EXHAUSTIVE (CLKCTRL_G: iI={4});
4          EXHAUSTIVE (GCLK: iI={4});
5          EXHAUSTIVE (TBIOC);
6          EXHAUSTIVE (BLK_CLK_BUF);
7          EXHAUSTIVE (PIN), MEASUREMENT=(TSU, TH);
8      };
```

Script 2

```
1      ROUTE "IO_TEST" {
2          EXHAUSTIVE (CLKPIN: iI={4});
3          EXHAUSTIVE (CLKCTRL_G: iI={4});
4          EXHAUSTIVE (GCLK: iI={4});
5          MAX_COUNT_WORK (TBIOC);
6          MAX_COUNT_WORK (BLK_CLK_BUF);
```

-continued

```
7        EXHAUSTIVE (PIN), MEASUREMENT=(TSU, TH);
8 };
```

The major differences of these two examples are lines 5 and 6. In the first script example, it is not explicitly specified which TBIOC or BLK_CLK_BUF since we want to cover all vertical I/Os. However, script 1 will produce more patterns than necessary because each pin can be reached by more than one BLK_CLK_BUF and the EXHAUSTIVE command guarantee that all these possible paths will be explored (see FIG. 2). In order to fix the TBIOC and BLK_CLK_BUF as we are testing the IOs, the command MAX_COUNT_WORK is used instead of EXHAUSTIVE in lines 5 and 6.

Resource constraint may also be incorporated in the script interface. All the routing decisions may start with some kind of resource constraint. The script interface has many operators that can operate on resource constraints. For example, the simplest one would be (UNIVERSE)

UNIVERSE is a reserve word. This is a universal constraint in which any resource would satisfy. In most case, it is desired want to have a constraint for a specific resource type, for example for TBIOC, (TBIOC)

The resource type may be constrained even more, for example, if it is desired to have TBIOC with index 2 and 4, and then the script command may be written as:

(TBIOC: iI={2, 4})

It should be appreciated that as many fields as desired may be in this constraint.

(TBIOC: iI={2}, iX={0})

Two different constraints can also be OR together:

(OR (LRIOC) (TBIOC:iI={2}))

For occasions where it is necessary to specify precisely which resources are allowed, then the following can occur:

(SET ("GCLK4" "GCLK5"))

In other embodiments, a variable may be used to represent A PORTION OF THE CONSTRAINT. In this embodiment, it is not necessary to hard code the constraint as discussed above. In yet another embodiment, branching may be used to allow routes of different lengths. For example, to test all the IOs instead of just vertical IOs, this may be specified as:

```
1     ROUTE "IO_TEST" {
2         EXHAUSTIVE (CLKPIN: iI={4});
3         EXHAUSTIVE (CLKCTRL_G: iI={4});
4         EXHAUSTIVE (GCLK: iI={4});
5         MAX_COUNT_WORK (OR ((TBIOC) (LRIOC)));
6         MAX_COUNT_WORK (BLK_CLK_BUF);
7         EXHAUSTIVE (PIN), MEASUREMENT=(TSU, TH);
8 };
```

On line 5, the constraint allows either a TBIOC resource or a Lower right input output clock (LRIOC) resource. One skilled in the art should understand that in this example, the connectivity of the device should allow such a route for the script to work. In one embodiment, LRIOC may never go directly from GCLK; instead a GCLK must go through a LRIOC_DRV before reaching a LRIOC. When this happens, branching is used as routing constraint. The example below shows how to use branching to allow routes of different length.

```
1     ROUTE "IO_TEST" {
2         EXHAUSTIVE (CLKPIN: iI={4});
3         EXHAUSTIVE (CLKCTRL_G: iI={4});
4         LABEL=GCV_LEVEL, EXHAUSTIVE (GCLK: iI={4});
5         MAX_COUNT_WORK (TBIOC);
6         MAX_COUNT_WORK (BLK_CLK_BUF);
7         EXHAUSTIVE (PIN), MEASUREMENT=(TSU, TH);
8         POSSIBLE_PATH=GCV_LEVEL;
9         MAX_COUNT_WORK (LRIOC_DRV);
10        MAX_COUNT_WORK(LRIOC);
11        MAX_COUNT_WORK(BLK_CLK_BUF);
12        EXHAUSTIVE (PIN), MEASUREMENT=(TSU,TH);
13 };
```

Branching requires user to define a label (line 4) that specifies where a branch starts and to define a branch point (line 8) that specifies where the branch is continued. It should be appreciated that one label could be used by more than one branch point. Discussed above were several ways for controlling routing decisions, e.g., Resource constraints/resource constraint variables, and by correctly using EXHAUSTIVE or MAX_COUNT_WORK commands. In another embodiment, routing decisions may be controlled based on blocking/unblocking. Recall that as a router finds a route, all the resources on the route will be label as USED. By using blocking/unblocking, a user can use the USED label to ensure a resource should not be used more than once during a single routing command.

```
1     R_UNMARK (GCLK) USED;
2     ROUTE "GCLK_TEST" {
3         EXHAUSTIVE (CLKPIN);
4         EXHAUSTIVE (CLKCTRL_G);
5         EXHAUSTIVE (GCLK), BLOCK=USED;
6         MAX_COUNT_WORK (LRIOC);
7         MAX_COUNT_WORK (BLK_CLK_BUF);
8         MAX_COUNT_WORK (PIN), MEASUREMENT=(TSU, TH);
9 };
```

The example above shows how to test all the GCLK by using IO clocks and pins on the common paths. CLKPIN and CLKCTRL_G are not fixed here because it is not known which clock pin can lead to which GCLK and therefore all need to be visited. In the case of the Armstrong architecture of the assignee, each clock pin can reach two GCLKs. Since it may be desired to only cover each GCLK once, the blocking/unblocking mechanism is used.

On line 1, all of the GCLK is unblocked for the USED label; and on line 5, the routing is blocked based on whether a GCLK is label as USED or not. If the router encounters the GCLK the first time, the USED label on the GCLK must be clear and the routing can go through. Eventually, a route is created with the GCLK and all the resources of the route (including the GCLK) will be labelled as used. Next time the router reaches the same GCLK from a different clock pin, the GCLK already has the USED label and the router will abort that route.

One skilled in the art should understand that the scripts discussed above are exemplary. Scripts can be written to target different parts of the device as described by the different embodiments discussed above. For example, scripts can be written to test TBIO 236 of I/O clock 206 of FIG. 2. In another embodiment, scripts may be used to avoid testing the same I/O pin multiple times by having commands incorporating a counter for the path that is used. As described above, the scripts can also be used to control the routing decisions by blocking and unblocking certain paths. In one embodiment, the script acts as an interface that allows users to define the design of the IC and specify how to stamp it across the device by using the most common path. As can be seen, the uses for scripts are numerous.

Figure 7:
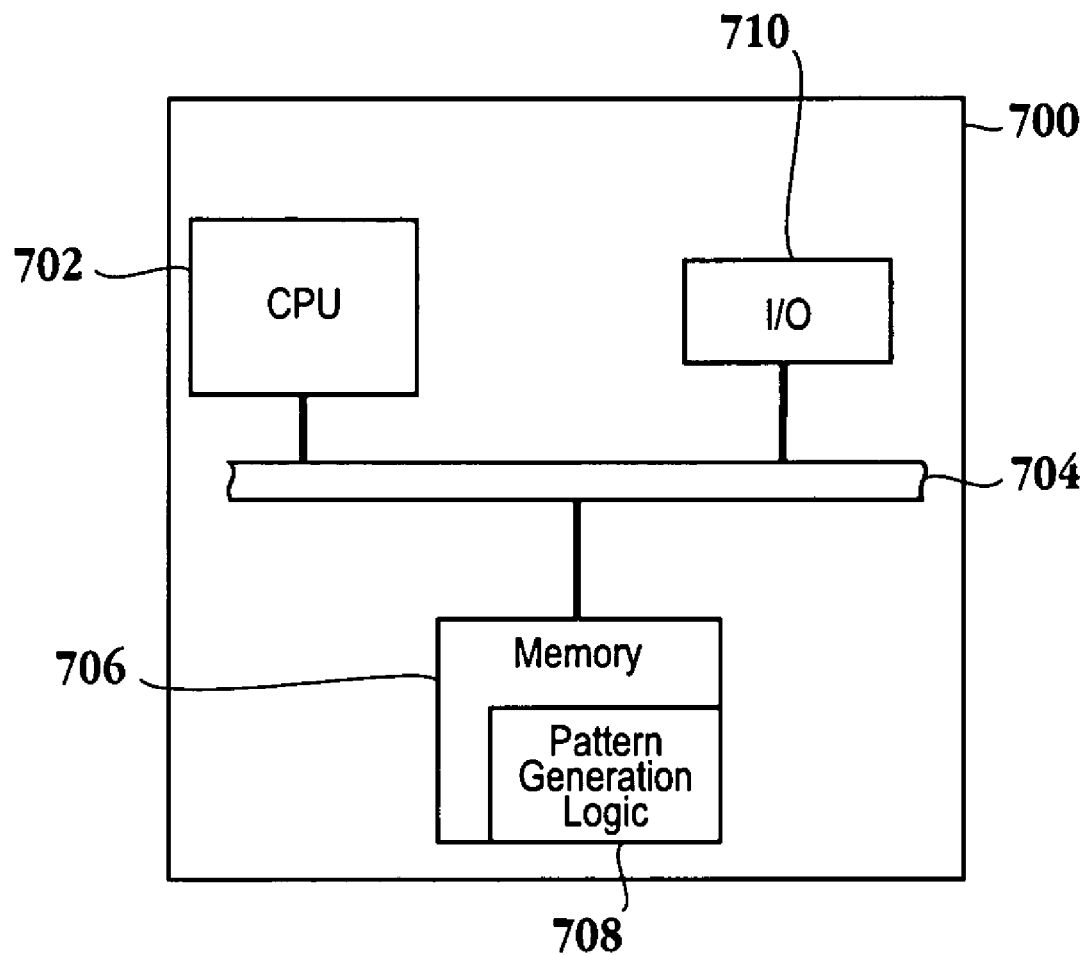
FIG. 7 is a simplified schematic diagram of an exemplary system configured to execute the functionality described herein in accordance with one embodiment of the invention.

FIG. 7 is a simplified schematic diagram of an exemplary system configured to execute the functionality described herein in accordance with one embodiment of the invention. The system includes central processing unit (CPU) 702, Input Output (I/O) module 710, memory 706 all communicating through bus 704. Memory 704 contains pattern generation logic 708. Pattern generation logic 708 may be program instructions that are executed by CPU 702 and cause the CPU to perform the functionality discussed herein. In another embodiment, system 700 may include the design software application and the AMS of FIG. 1. Thus, the system is packaged as a single integrated unit in this embodiment.

The method and system described herein may be used to generate characterization patterns for any IC. The IC for example, may be programmable logic devices such as field programmable gate array (FPGA), programmable array logic (PAL), programmable logic array (PLA), field programmable logic array (FPLA), electrically programmable logic devices (EPLD), electrically erasable programmable logic device (EEPLD), logic cell array (LCA), just to name a few. The programmable logic device may be a part of a data processing system that includes one or more of the following components: a processor, memory, I/O circuitry, and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. It should be appreciated that even though specific reference to was made to QUARTUS design software the embodiment may be employed with any design software.

Any of the operations described herein, that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data that can be thereafter read by a computer system. The computer readable medium also includes an electromagnetic carrier wave in which the computer code is embodied. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operations, unless explicitly stated in the claims.

What is claimed is:

1. A computer-implemented method for generating design characterization patterns for an integrated circuit (IC), comprising method operations of:
    selecting a routing scheme from a file containing a plurality of routing schemes;
    identifying resource types within the routing scheme;
    tracing a path connecting each of the resource types while traversing the path in a first direction;
    retracing the path in a second direction according to defined constraints to identify alternative paths;
    building, while traversing the path in the first direction, an alternative path sharing a portion of the path; and
    comparing expected timings generated for each path to actual timings generated from physical tests of the integrated circuit.

2. The method of claim 1, wherein the routing scheme is an electrical pathway within the IC.

3. The method of claim 1, wherein the routing scheme is associated with one of a phase locked loop, a delay element, input/output, or a clock tree.

4. The method of claim 1, wherein the method operation of selecting the routing scheme includes,
    culling the plurality of routing schemes to identify routing schemes associated with one of a phase locked loop, a delay element, an input/output block or a clock tree.

5. The method of claim 1, wherein the method operation of building, while traversing the path in the first direction, an alternative path sharing a portion of the path includes,
    deviating from the path; and
    returning to the path along a return segment closest to the deviation from the path.

6. The method of claim 5, further comprising:
    obtaining actual measurements for the path and the alternative path; and
    characterizing relative timing between a portion of the alternative path associated with the deviation from the path and a corresponding portion of the path based on the actual measurements.

7. The method of claim 1, wherein the method operation of retracing includes,
    returning to a previous resource type;
    identifying an alternative path segment emanating from the previous resource type; and
    repeating the returning and the identifying for a next previous resource type.

8. The method of claim 1, wherein each of the method operations are embodied as program instructions on a computer readable medium.

9. The method of claim 1, wherein the path is traced, retraced, and built over multiple clock domains.

10. A computing system for testing an integrated circuit, comprising:
a processor; and
a memory in communication with the processor over a bus, the memory includes program instructions to be executed by the processor, the program instructions causing the processor to perform a method comprising:
selecting a routing scheme from a file containing a plurality of routing schemes;
identifying resources within the routing scheme;
tracing a path connecting each of the resources while traversing the path in a first direction;
retracing the path in a second direction according to defined constraints to identify alternative paths;
building, while traversing the path in the first direction, an alternative path sharing a portion of the path; and
comparing expected timings generated for each path of the file to actual timings generated from physical tests of the integrated circuit.

11. The computing system of claim 10, further comprising:
a counter associated with each resource, when a new path is created, the counter of each resource along the path being incremented.

12. The computing system of claim 10, further comprising:
an automated measurement system configured to communicate with the integrated circuit and perform physical measurements associated with timing and power characteristics of signals traversing the paths.

13. The computing system of claim 12, wherein the computing system generates test configuration files for each of the paths in a format that can be input into the automated measurement system to trigger performance of the physical measurements.

14. The computing system of claim 10, wherein the path is traced, retraced, and built over multiple clock domains.

* * * * *